(12) United States Patent
Kahlman et al.

(10) Patent No.: US 7,508,200 B2
(45) Date of Patent: Mar. 24, 2009

(54) MEANS AND METHOD FOR REDUCING MAGNETIC CROSS-TALK IN BIOSENSORS

(75) Inventors: Josephus Arnoldus Henricus Maria Kahlman, Eindhoven (NL); Bart Michiel De Boer, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 48 days.

(21) Appl. No.: 11/719,955

(22) PCT Filed: Nov. 28, 2005

(86) PCT No.: PCT/IB2005/053933

§ 371 (c)(1),
(2), (4) Date: May 23, 2007

(87) PCT Pub. No.: WO2006/067646

PCT Pub. Date: Jun. 29, 2006

(65) Prior Publication Data

US 2008/0129286 A1 Jun. 5, 2008

(30) Foreign Application Priority Data

Nov. 30, 2004 (EP) ................. 04106194

(51) Int. Cl.
*G01N 27/72* (2006.01)
*G01R 33/12* (2006.01)
*G01R 33/02* (2006.01)
*C12M 1/34* (2006.01)

(52) U.S. Cl. .................. 324/225; 324/207.12; 324/252; 435/287.1

(58) Field of Classification Search ............ 324/207.12, 324/225, 228, 249, 252; 435/287.1; 436/526, 436/806; 422/82.01
See application file for complete search history.

(56) References Cited

U.S. PATENT DOCUMENTS 5,457,382 A * 10/1995 Stein .................... 324/239

(Continued)

FOREIGN PATENT DOCUMENTS

WO   WO03054523 A2   7/2003

(Continued)

OTHER PUBLICATIONS

Kotitz et al: "Determination of the Binding Reaction Between Avidin and Biotin by Relaxation Measurements of Magnetic Nanoparticles"; Journal of Magnetism and Magnetic Materials 194, 1999, pp. 62-68.

(Continued)

*Primary Examiner*—Bot LeDynh

(57) ABSTRACT

A magnetic sensor (MS) for sensing a magnetic stray field (SF) generated by magnetizable object (SPB) when magnetized and for generating an electrical object signal ($U_{OB}$) which depends on the sensed magnetic stray field (SF), comprising a magnetic field generator ($WR_1$, $WR_2$) for generating a magnetic main field (H) for magnetizing the magnetizable object (SPB), and cross-talk reduction means for reducing the effect of a cross talk signal component in the electrical object signal ($U_{OB}$) caused by magnetic cross-talk between the magnetic main field (H) and the magnetic stray field (SF), wherein the cross-talk reduction means is arranged for distinguishing a signal property between the cross-talk signal component and the remaining part of the electrical object signal ($U_{OB}$) and for generating an electrical output signal ($U_o$).

17 Claims, 7 Drawing Sheets

U.S. PATENT DOCUMENTS 5,981,297 A    11/1999   Baselt
6,992,482 B2 *   1/2006   Shay et al. .................. 324/235

FOREIGN PATENT DOCUMENTS

WO    WO2005010503 A1    2/2005
WO    WO2005010543 A1    2/2005

OTHER PUBLICATIONS

Smith et al: "Magnetic Biosensors"; Sensors, Dec. 1, 1999, Whole Document, XP002300943.

* cited by examiner

MEANS AND METHOD FOR REDUCING MAGNETIC CROSS-TALK IN BIOSENSORS This application is a national stage filing under 35 U.S.C. 371 of International Application No. PCT/IB05/53933, filed Nov. 28, 2005, which claims priority from EPO Application No. 04106194.6, filed Nov. 30, 2004, the specification of which is incorporated by reference herein.

The invention relates to a method for sensing a magnetic stray field generated by a magnetizable object when magnetized.

The invention further relates to a magnetic sensor which performs said sensing and the use of such a sensor in a biochip for e.g. molecular diagnostics, biological sample analysis or chemical sample analysis.

The introduction of micro-arrays or biochips is revolutionizing the analysis of samples for DNA (desoxyribonucleic acid), RNA (ribonucleic acid), nucleic acids, proteins, cells and cell fragments, tissue elements, etcetera. Applications are e.g. human genotyping (e.g. in hospitals or by individual doctors or nurses), medical screening, biological and pharmacological research, detection of drugs in saliva. The aim of a biochip is to detect and quantify the presence of a biological molecule in a sample, usually a solution.

Biochips, also called biosensors, biosensor chips, biological microchips, gene-chips or DNA chips, consist in their simplest form of a substrate on which a large number of different probe molecules are attached, on well defined regions on the biochip, to which molecules or molecule fragments that are to be analysed can bind if they are matched.

The term "substrate" may include any underlying material or materials that may be used, or upon which a device, a circuit or an epitaxial layer may be formed. The term "substrate" may also include a semiconductor substrate such as e.g. a doped silicon, a gallium arsenide (GaAs), a gallium arsenide phosphide (GaAsP), an indium phosphide (InP), a germanium (Ge), or a silicon germanium (SiGe) substrate. The "substrate" may include, for example, an insulating layer such as a $SiO_2$ or an $Si_3N_4$ layer in addition to a semiconductor substrate portion. Thus the term "substrate" also includes glass, plastic, ceramic, silicon-on-glass, silicon-on-sapphire substrates. The term "substrate" is thus used to define generally the elements for layers that underlie a layer or portions of interest. Also the "substrate" may be any other base on which a layer is formed, for example a glass or metal layer.

For example, a fragment of a DNA molecule binds to one unique complementary DNA (c-DNA) molecular fragment. The occurrence of a binding reaction can be detected, e.g. by using fluorescent markers that are coupled to the molecules to be analysed. As an alternative to fluorescent markers magnetizable objects can be used as magnetic markers that are coupled to the molecules to be analysed. It is the latter type of markers which the present invention is dealing with. In a biochip said magnetizable objects are usually implemented by so called superparamagnetic beads. This provides the ability to analyse small amounts of a large number of different molecules or molecular fragments in parallel, in a short time. One biochip can hold assays for 10-1000 or more different molecular fragments. It is expected that the usefulness of information that can become available from the use of biochips will increase rapidly during the coming decade, as a result of projects such as the Human Genome Project, and follow-up studies on the functions of genes and proteins. A general explanation of the functioning of the biochip has already been described in the international patent application of the present applicant published as WO 03/054523 A2.

A biochip consisting of an array of sensors (e.g. 100) based on the detection of superparamagnetic beads may be used to simultaneously measure the concentration of a large number of different molecules (e.g. protein, DNA, drugs of abuse, hormones) in a sample fluid (e.g. a solution like blood or saliva). The sample fluid comprises a target molecule species or an antigen. Any biological molecule that can have a magnetic label (marker) can be of potential use. The measurement may be achieved by attaching a superparamagnetic bead to the target, magnetizing this bead with an applied magnetic field, and using (for instance) a Giant Magneto Resistance (GMR) sensor to detect the stray field of the magnetized beads.

In the current patent application focus is on a biochip based on excitation of superparamagnetic nanoparticles. However also the application in other magneto resistive sensors like Anisotropic Magneto Resistor (AMR) and Tunnel Magneto Resistor (TMR) is part of the invention. The magnetic field generator may comprise a current flowing in a wire which generates a magnetic field, thereby magnetizing a superparamagnetic bead. The stray field from the superparamagnetic bead introduces an in-plane magnetization component in the GMR, which results in a resistance change.

For further explanation of the background of the invention reference is made to FIGS. 1 and 2.

FIG. 2 shows an embodiment of a magnetic sensor MS on a substrate SBSTR. A single or a multiple of such (a) sensor(s) may be integrated on the same substrate SBSTR to form a biochip BCP as is schematically indicated in FIG. 1. The magnetic sensor MS comprises a magnetic field generator which, in this example, is integrated in the substrate SBSTR e.g. by a first current conducting wire $WR_1$. It may also comprise a second (or even more) current conducting wire $WR_2$. Also other means instead of a current conducting wire may be applied to generate the magnetic field H. The magnetic field generator may also be located outside (external excitation) the substrate SBSTR. In each magnetic sensor MS a magnetoresistive element, for example a giant magnetoresistive resistor GMR, is integrated in the substrate SBSTR to read out the information gathered by the biochip BCP, thus to read out the presence or absence of target particles TR via magnetizable objects thereby determining or estimating an areal density of the target particles TR. The magnetizable objects are preferably implemented by so called superparamagnetic beads SPB. Binding sites BS which are able to selectively bind a target TR are attached on a probe element PE. The probe element PE is attached on top of the substrate SBSTR.

The functioning of the magnetic sensor MS or more generally of the biochip BCP is as follows. Each probe element PE is provided with binding sites BS of a certain type. Target sample TR is presented to or passed over the probe element PE, and if the binding sites BS and the target sample TR match, they bind to each other. The superparamagnetic beads SPB are directly or indirectly coupled to the target sample TR. The superparamagnetic beads SPB allow to read out the information gathered by the biochip BCP. Superparamagnetic particles are suspended in a (polymer) binder or a matrix of which at zero applied magnetic field the time-averaged magnetization is zero due to thermally induced magnetic moment reversals that are frequent on the time scale of the magneti zation measurement. The average reversal frequency is given by $$v = v_0 \exp \frac{-KV}{kT}$$

where KV (with K the magnetic anisotropy energy density and V the particle volume) is the energy barrier that has to be overcome, and $v_0$ is the reversal attempt frequency (typical value: $10^9$ s$^{-1}$), k is the Boltzmann constant, and T is the absolute temperature (in Kelvin).

The magnetic field H magnetizes the superparamagnetic beads SPB which as a response generate a stray field SF which can be detected by the GMR. Although not necessary the GMR should preferably be positioned in a way that the parts of the magnetic field H which passes through the GMR is perpendicular to the sensitive direction of the layer of the GMR. A total external (that is to say not internal in the GMR) field for which the GMR is sensitive is indicated by $H_{ext}$ in FIG. 2.

With the assumption that the biochip BCP is horizontally positioned (thus perpendicular to the force of gravity) the GMR is positioned in a manner that it is only or mainly sensitive to magnetic fields having a horizontal component. This is to minimize the sensitivity of the GMR to the magnetic field H and thus to minimize a magnetic cross-talk between the magnetic field H and the GMR. If the magnetic field H would pass the GMR perfectly perpendicular to the GMR this magnetic field H would not have a horizontal component. In contrast the stray field SF does have a horizontal component and will thus generate a difference in the resistance value of the GMR. By this an electrical output signal (e.g. generated by a current change through the GMR when biased by a DC voltage, not shown in FIG. 1) can be delivered by the sensor MS which is a measure for the amount of targets TR. In practice however the GMR can not be made infinitesimal small (in vertical direction). Therefore a horizontal component of the magnetic field H is always available (when the applied magnetic field line are not completely homogenous, e.g. the circle symmetrical magnetic field generated by the integrated current). Further the GMR may not be perfectly sensitive in only one direction. Further the alignment of the magnetic field H with the GMR may not be perfect or even undesired for some mechanical positional reasons. All these imperfections lead to a certain cross-talk between the magnetic field and the GMR, that is to say that the sensed output signal is not only dependent on the magnetic stray field SF but also directly on the magnetic field H. This cross-talk is indicated as $H_x$ in FIG. 2. The cross-talk reduces the accuracy of the measurements of the concentration of a large number of different biological molecules. Especially in cases where the magnetic stray field SF is very weak (or the magnetic crosstalk field is not stable), and thus a very high sensitivity of the magnetic sensor MS is needed, the accuracy of the measurement may be too bad. For very sensitive measurements it can even occur that the magnetic cross-talk is tenths of times higher than the magnetic stray field SF. This of course makes the measurement useless. Therefore there is a high need to decrease the magnetic cross-talk or to reduce the effect of the magnetic cross-talk.

It is therefore an object of the invention to provide a magnetic sensor for sensing a magnetic stray field generated by a magnetizable object when magnetized which generates an output signal which virtually solely depends on the sensed magnetic stray field.

In order to achieve this object the invention provides a magnetic sensor for sensing a magnetic stray field generated by a magnetizable object when magnetized and for generating an electrical object signal which depends on the sensed magnetic stray field, comprising a magnetic field generator for generating a magnetic main field for magnetizing the magnetizable object, and cross-talk reduction means for reducing the effect of a cross-talk signal component in the electrical object signal caused by magnetic cross-talk between the magnetic main field and the magnetic stray field, wherein the cross-talk reduction means is arranged for distinguishing a signal property between the cross-talk signal component and the remaining part of the electrical object signal and for generating an electrical output signal.

By distinguishing a signal property between the cross-talk signal component and the remaining part of the electrical object signal the cross-talk can be isolated from the object signal and thus a cross-talk free output signal can be created.

The signal property may for instance be the phase of a signal. Discrimination between the magnetic cross-talk, thus magnetic field coming directly from the magnetic field generator, and the magnetic stray field, thus magnetic field coming from the magnetic field generator via the paramagnetic beads, is possible by the fact that the magnetic stray field lags in time compared to the (direct) magnetic field. The cross-talk reduction means may comprise means for generating an orthogonal electrical signal which is orthogonal in relation to the cross-talk signal component, and a multiplier for multiplying the orthogonal electrical signal with the electrical object signal. The resulting signal after said multiplication forms a basis for the electrical output signal. The resulting signal may be directly used as the electrical output signal. However preferably the cross-talk reduction means comprises a low-pass filter for filtering said resulting signal after said multiplication. The low-pass filter then produces the electrical output signal. The frequency of the magnetic main field may be chosen such that the phase difference between the sensed magnetic stray field and the magnetic main field expressed in radians approximately equals $\pi/2+n\,\pi$, in which n is an integer number. By doing so the gain of the sensor is maximized.

Another signal property may for instance be the amplitude of a signal. This can for instance be applied if the magnetic main field comprises a first magnetic signal having a first frequency and a second magnetic signal having a second frequency which is substantially larger than the first frequency and which is larger than the magnetization cut-off frequency of the magnetizable object. For frequencies higher than the magnetization cut-off frequency the strength of the produced magnetic stray field will ever decrease by increasing frequency. The first and second magnetic signals produce a first electrical signal component in the electrical object signal having the first frequency and having a first amplitude and producing a second electrical signal component in the electrical object signal having the second frequency and a second amplitude. The cross-talk reduction means comprises means for measuring the amplitudes of the first and the second electrical signal components and for mutually subtracting the measured amplitudes. The resulting signal after said subtraction forms a basis for the electrical output signal. The resulting signal may be directly used as the electrical output signal. However preferably the cross-talk reduction means comprises a low-pass filter for filtering said resulting signal after said multiplication. The low-pass filter then produces the electrical output signal. Preferably the first frequency is lower than said magnetization cut-off frequency and the second frequency is much higher than said magnetization cut-off frequency. By doing so the magnetic cross-talk field and the magnetic stray field are both virtually unweakened at the GMR at the first frequency while at the second frequency the magnetic cross-talk field is virtually unweakened and the magnetic stray field is weakened dramatically. This makes the canceling of the cross-talk very easy since then the both resulting objects signals having respectively the first and second frequency need only to be mutually subtracted, thus without the need for adapting the amplitude of at least one of the object signals.

In the above mentioned embodiments of the invention the effect of the magnetic cross-talk is reduced. It is however also possible to more directly eliminate the magnetic cross-talk. Therefore the invention also provides a magnetic sensor for sensing a magnet stray field generated by a magnetizable object when magnetized and for generating an electrical object signal which depends on the sensed magnetic stray field, comprising a first external magnetic field generator for generating a first magnetic main field for magnetizing the magnetizable object, and cross-talk reduction means for reducing a cross-talk signal component in the electrical object signal caused by magnetic cross-talk between the first external magnetic main field and the magnetic stray field, the cross-talk reduction means comprising a second external magnetic field generator for generating a second magnetic main field for compensating for the magnetic cross-talk between the first external magnetic main field and the magnetic stray field SF. By choosing the appropriate values for the amplitude and the phase of the second magnetic main field the magnetic cross-talk is eliminated. The first and second external magnetic field generators may for instance comprise first and second coils through which respectively first and second AC-currents, having the same frequency, flow during operation of the magnetic sensor. The cross-talk reduction means may comprise means for adapting the ratio of the amplitudes of the first and second AC-currents for minimizing the magnetic cross-talk. It may further comprise means for adapting the difference of the phases of the first and second AC-currents for further reducing the magnetic cross-talk. This is an easy way of adapting the mutual strength of the first and second magnetic fields and their mutual phases since no mechanical adaptations are necessary. Possibly the adaptation can be performed automatically, e.g. by applying generally known feedback techniques.

The invention further provides a method for sensing a magnetic stray field generated by a magnetizable object when magnetized comprising the steps of:

in a first main step applying the steps of:
  generating a magnetic main field in the absence of any magnetizable object,
  sensing the magnetic field as if it would have been a magnetic stray field generated from a magnetizable object if it would have been present,
  generating an electrical object signal from the sensed magnetic field,
  measuring the amplitude of the electrical object signal, and storing the amplitude of the electrical object signal in a memory, in a second main step applying the steps of:
  generating a magnetic main field for magnetizing the magnetizable object,
  sensing the magnetic stray field generated from the magnetizable object,
  generating a further electrical object signal from the sensed magnetic stray field, and
  measuring the amplitude of the further electrical object signal,
  retrieving the stored amplitude of the electrical object signal, and
  mutually subtracting the stored amplitude and the amplitude of the further electrical object signal thereby generating an electrical output signal.

An advantage of this method over the previously mentioned ways of reducing (the effect of ) the magnetic cross-talk is the fact that no functional changes in the sensor are necessary. So therefore is can also successfully be applied to not only the inventive biochip as disclosed in the present patent application, but also to prior art biochips.

The invention will be further elucidated with reference to the accompanying drawings, in which.

Figure 7:
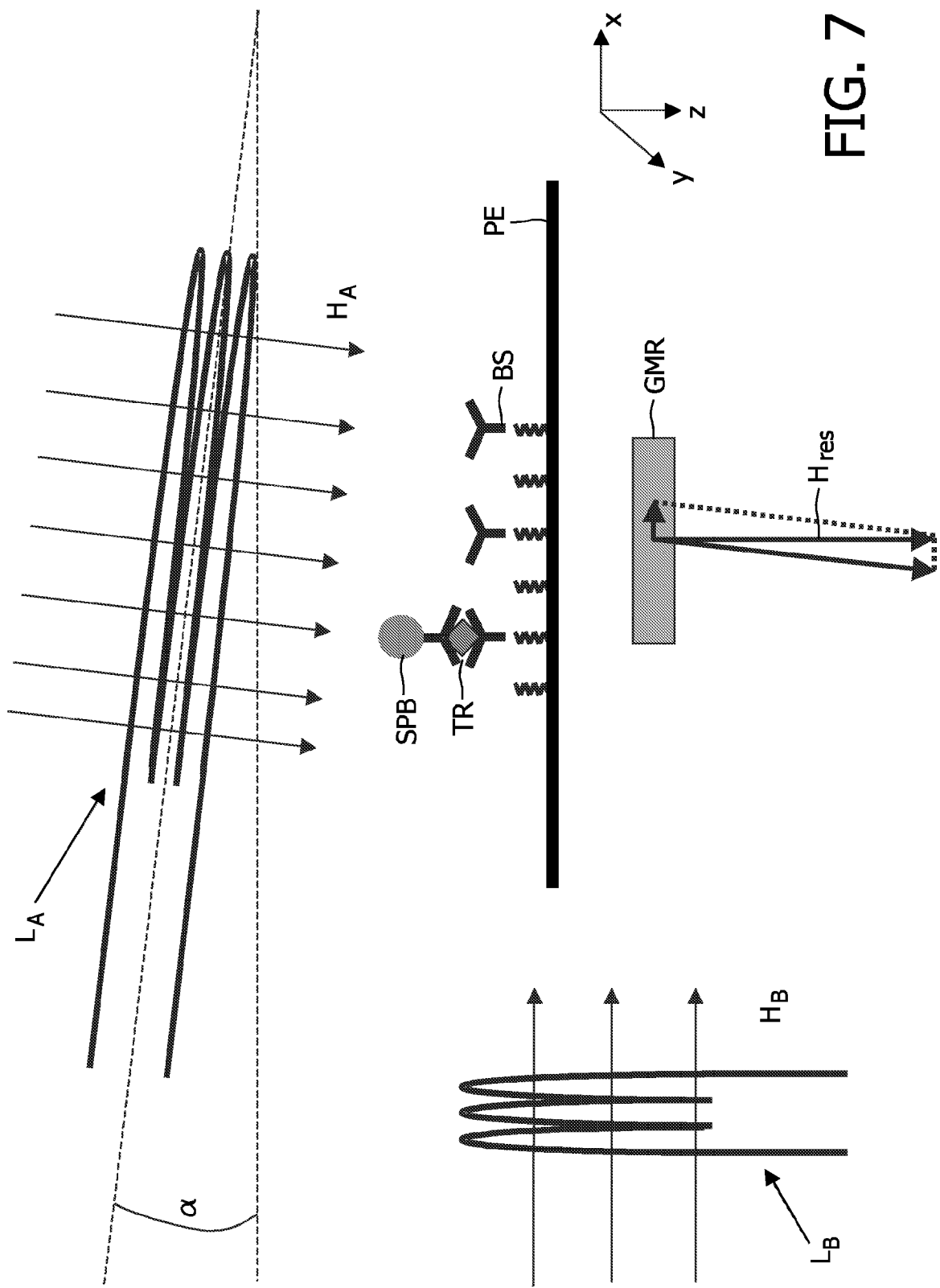
Figure 8:
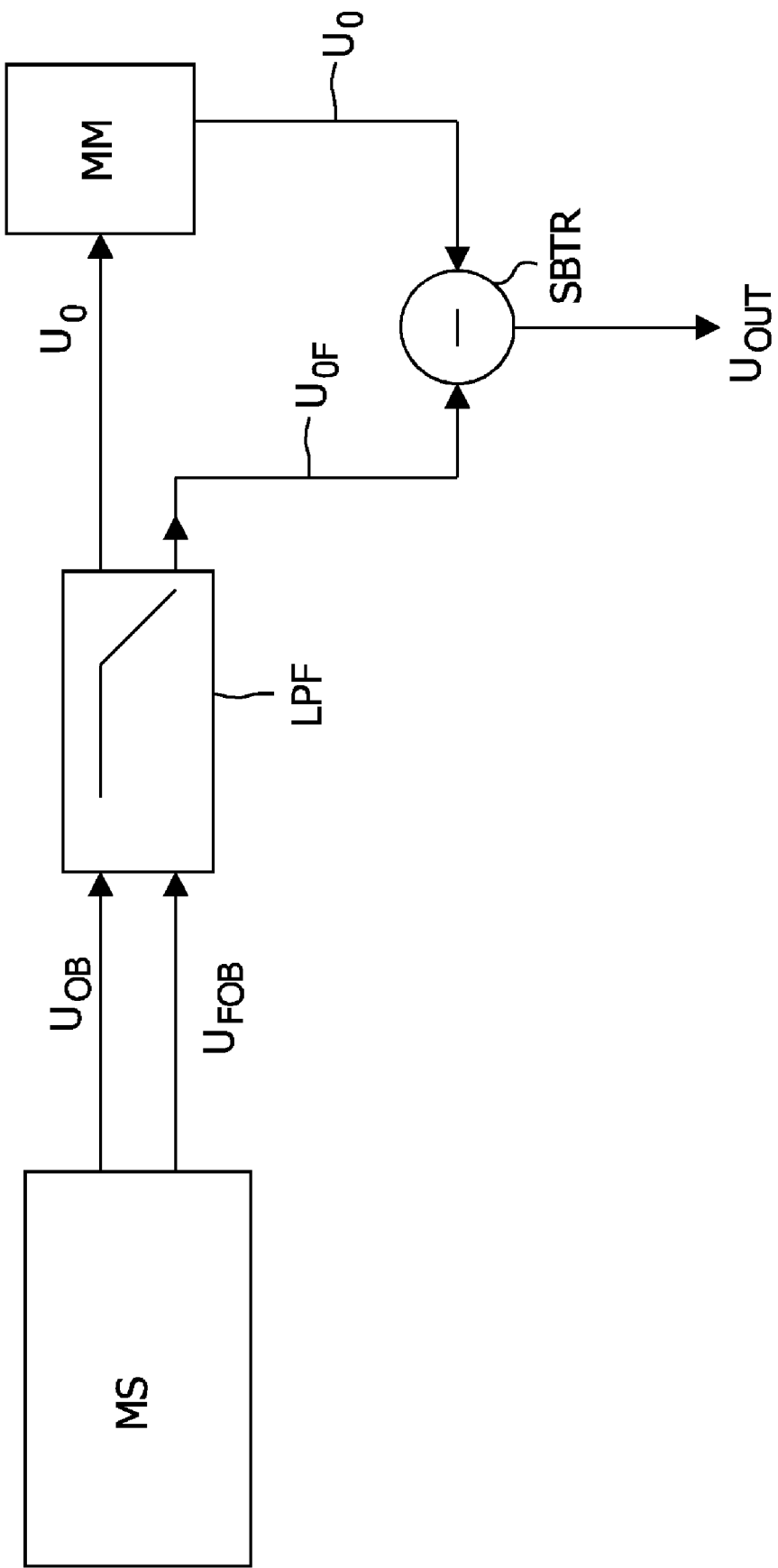

FIG. 7 shows an embodiment of the invention in which an additional magnetic field is generated to compensate for the magnetic cross-talk field; and FIG. 8 shows an inventive method in which before the actual (bio-) measurement, when no paramagnetic beads are present yet, the amplitude of the object signal is measured and stored, and during the actual measurements, when paramagnetic beads are present, the stored amplitude is subtracted from the amplitude of the current object signal, thereby delivering a cross-talk-free output signal.

The drawings are only schematic and non-limiting. In the drawings the size of some of the elements may be exaggerated and not drawn on scale and serve only for illustrative purposes. The description to the Figures only serve to explain the principles of the invention and may not be construed as limiting the invention to this description and/or the Figures.

Figure 3:
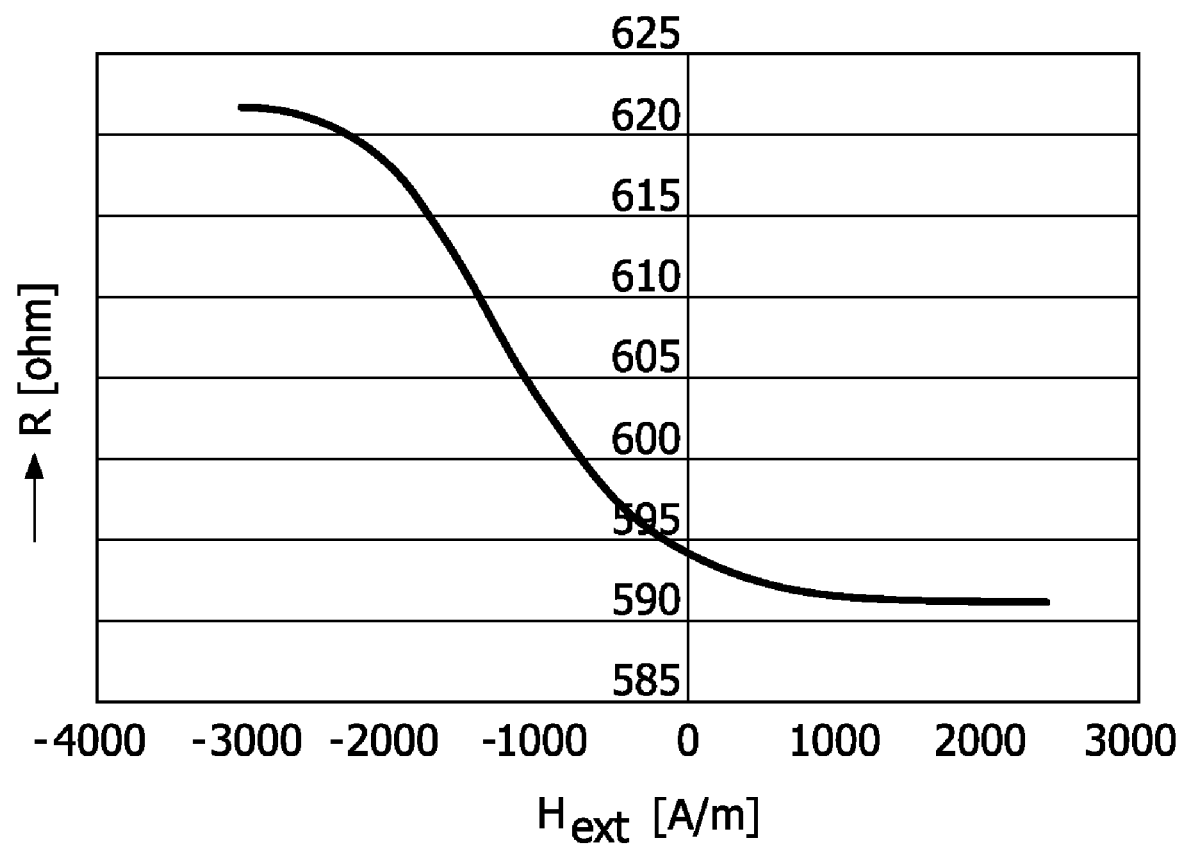
FIG. 3 shows the resistance of a GMR as a function of the magnetic field component in the direction in which the layer of the GMR is sensitive to magnetic fields.

FIG. 3 shows the resistance of the GMR as a function of the magnetic field component $H_{ext}$. It is to be noted that the GMR sensitivity $$s_{GMR} = \frac{dR_{GMR}}{dH_{ext}}$$

is not constant but depends on $H_{ext}$.

Figure 2:
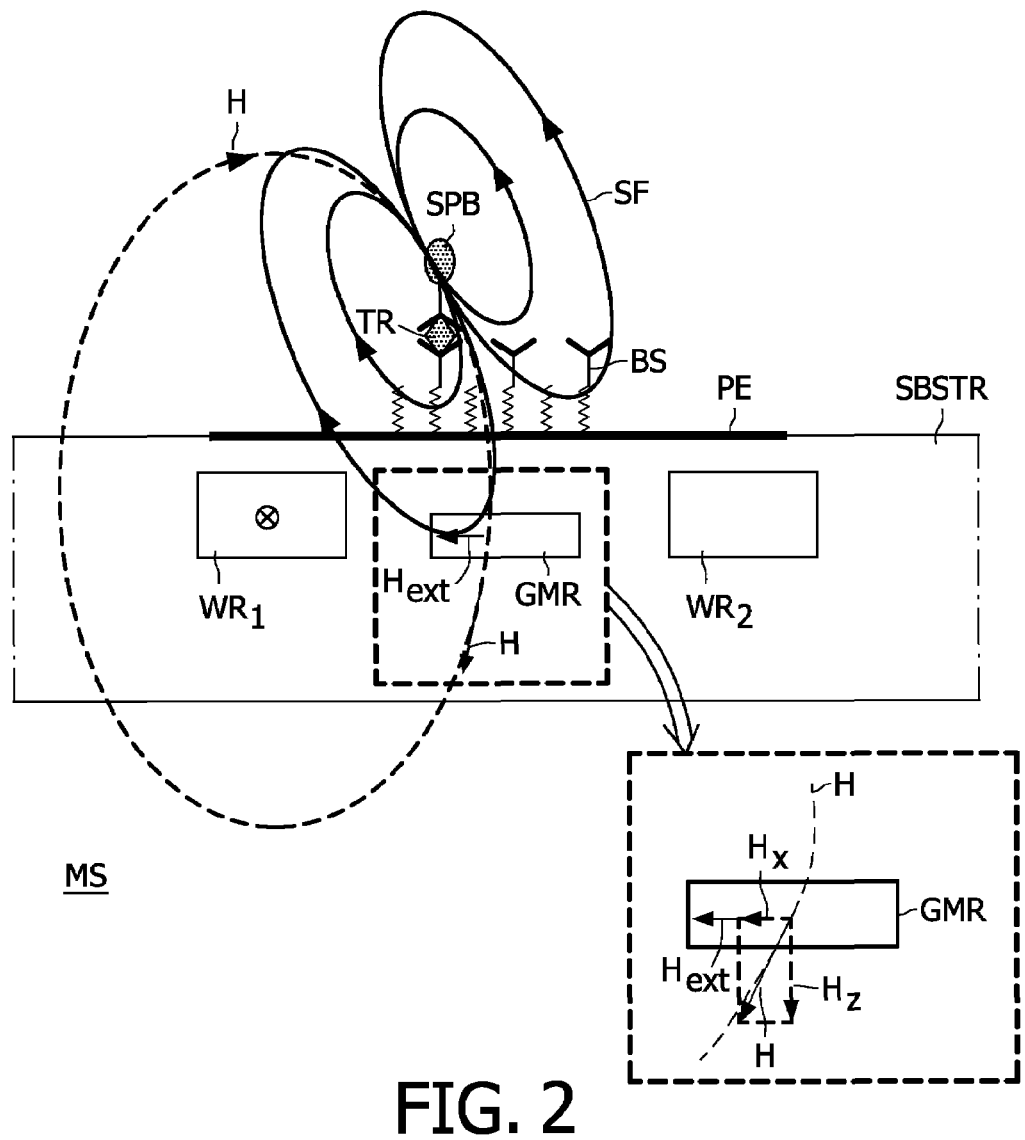
FIG. 2 shows an embodiment of a magnetic sensor with integrated magnetic field excitation.

In the sensor MS as shown in FIG. 2, instead of the giant magnetoresistive GMR any other means which have a property (parameter) which depends on magnetic field such as certain types of resistors like a tunnel magnetoresistive (TMR) or an anisotropic magnetoresistive (AMR) can be applied. In an AMR, GMR or TMR material, the electrical resistance changes when the magnetization direction of one or more layers changes as a result of the application of a magnetic field. GMR is the magnetoresistance for layered structures with conductor interlayers in between so-called switching magnetic layers, and TMR is the magneto-resistance for layered structures comprising magnetic metallic electrode layers and a dielectric interlayer.

In GMR technology, structures have been developed in which two very thin magnetic films are brought very close together. A first magnetic film is pinned, what means that its magnetic orientation is fixed, usually by holding it in close proximity to an exchange bias layer, a layer of antiferromagnetic material that fixes the first magnetic film's magnetic orientation. A second magnetic layer or free layer, has a free, variable magnetic orientation. Changes in the magnetic field, in the present case originating from changes in the magnetization of the superparamagnetic particles SPB, cause a rotation of the free magnetic layer's magnetic orientation, which in turn, increases or decreases the resistance of the GMR structure. Low resistance generally occurs when the sensor and pinned layers are magnetically oriented in the same direction. Higher resistance occurs when the magnetic orientations of the sensor and pinned layers (films) oppose each other.

TMRs are made of two ferromagnetic electrode layers separated by an isolating (tunnel) barrier. This barrier must be very thin, i.e., of the order of 1 nm. Only then, the electrons can tunnel through this barrier. This is a quantum-mechanical transport process. The magnetic alignment of one layer can be changed without affecting the other by making use of an exchange bias layer. Changes in the magnetic field, in the present case originating from changes in the magnetization of the superparamagnetic particles SPB, cause a rotation of the sensor film's magnetic orientation, which in turn, increases or decreases resistance of the TMR structure.

In AMRs the resistance of ferromagnetic materials is the dependent on the angle the current makes with the magnetization direction. This phenomenon is due to an asymmetry in the electron scattering cross section of ferromagnet materials.

Figure 1:
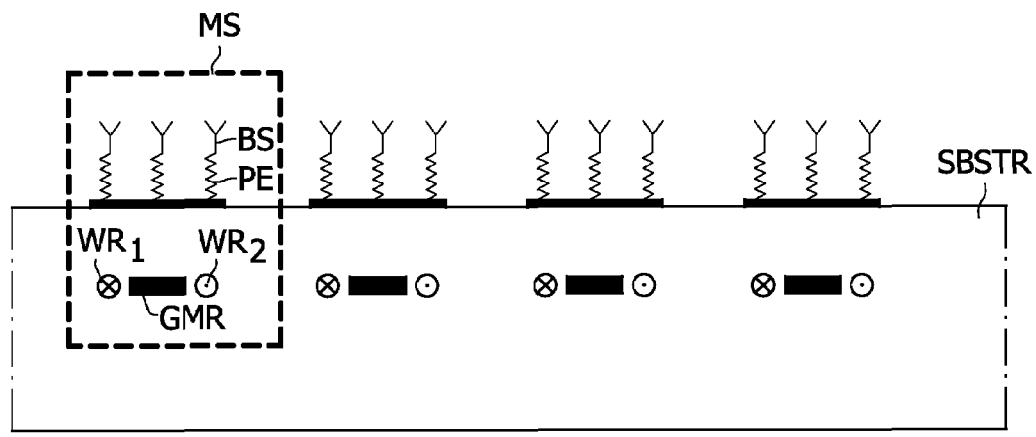
FIG. 1 shows a biochip comprising a substrate and a plurality of magnetic sensors.
Figure 4:
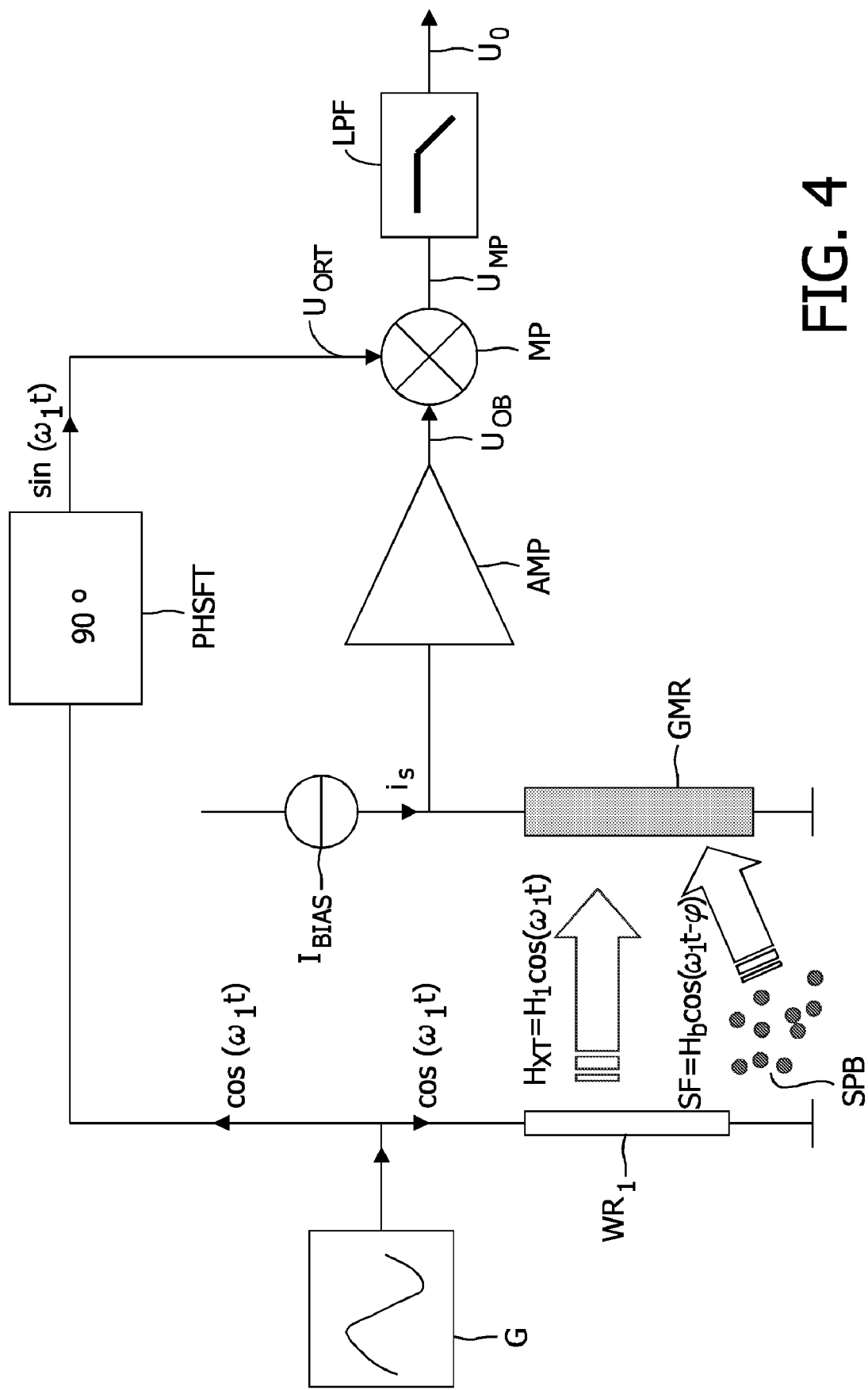
FIG. 4 shows an embodiment of the invention in which the phase difference of the cross-talk signal and the sensed stray field is used to discriminate between the cross-talk signal component in the object signal and the remainder of the object signal.

FIG. 4 shows an embodiment of the invention in which the phase difference of the cross-talk signal and the sensed stray field SF is used to discriminate between the cross-talk signal component in the object signal $U_{OB}$ and the remainder of the object signal. The magnetic sensor MS comprises a generator G for generating an AC-voltage/current having a radian frequency $\omega_1$. It generates an AC-current through a wire $WR_1$ which as a response generates a magnetic main field H (see FIG. 2). The magnetic main field H magnetizes the superparamagnetic beads SPB which as a response generate a stray field SF (see also FIG. 2). As explained earlier with reference to FIGS. 1 and 2 the GMR can sense the magnetic stray field SF since it comprises a large component in the sensitive (x-) direction of the GMR. (See the x- direction in FIG. 2.) As explained previously there is always some component of the sensed magnetic field in the GMR in the horizontal direction which originates directly, that is to say not via the paramagnetic beads SPB, from the magnetic main field H. This so-called magnetic cross-talk is indicated by $H_{XT}$ in FIG. 4. The GMR is biased with a current $i_s$ delivered by a DC-current source $I_{BIAS}$. The current $i_s$ generates an internal magnetic field in the GMR. Therefore by choosing the appropriate value for the current $i_s$ the curve shown in FIG. 3 can be "moved" horizontally and a suitable sensitivity of the GMR can be chosen. In most cases the highest possible sensitivity ("highest" negative slope in the curve of FIG. 3) will be chosen. The magnetic sensor MS further comprises an amplifier AMP, a phase shifter PHSFT, a multiplier MP, and a frequency low-pass filter LPF. An input of the amplifier AMP is coupled to receive a voltage change, caused by the stray field SF, across the GMR. This voltage change is buffered and preferably amplified by the amplifier AMP which delivers an object signal $U_{OB}$ at an output of the amplifier AMP. An input of the phase shifter PHSFT is coupled to receive an AC-signal which is in phase with the AC-current through the wire $WR_1$, and thus also in phase with the main magnetic field H and the cross-talk field $H_{XT}$. The phase shifter PHSFT delivers an orthogonal electrical signal $U_{ORT}$ which is 90 degrees delayed in phase compared to the AC-signal at the input of the phase shifter PHSFT. The magnetic cross-talk $H_{XT}$ is expressed by equation [1]:

$$H_{XT}=H_1 \cos \omega_1 t \qquad [1]$$

The field component of the magnetized paramagnetic beads SPB, as observed by the magnetic sensor MS, will lag an amount of phase φ behind the cross talk field $H_{XT}$. Thus the stray field SF is expressed by equation [2]:

$$SF=H_b \cos(\omega_1 t - \phi) \qquad [2]$$

$H_b$ depends on the number of beads.

This effect of the lag is modeled by magnetization- and the relaxation time constants. The relaxation time constant $\tau_{neel}$ expresses the relaxation time when the excitation field is reduced to zero. (see for Neel relaxation: "Journal of Magnetism and Magnetic Materials 194 (1999) page 62 by R. Kötiz et al.). Due to the time it takes to magnetize the paramagnetic beads SPB, the stray field SF of the paramagnetic beads SPB will lag behind the applied magnetic main field H. This is in contrast with the cross-talk field $H_{XT}$ which have approximately the same phase as the phase of the magnetic main field H. At a radian frequency $\omega<<1/\tau_{Neel}$ the phase lag φ is small. However, the phase of the cross talk field $H_{XT}$, which is essentially a component of the applied magnetic main field H, does not change. This still results in a phase difference between the magnetic cross talk field $H_{XT}$ and the stray field SF from the paramagnetic beads SPB in the magnetic sensor MS. After amplification by the amplifier AMP, the object signal $U_{OB}$ is demodulated with the orthogonal electrical signal $U_{ORT}=\sin \omega_1 t$. This demodulation is performed by the multiplier MP which multiplies the object signal $U_{OB}$ with the orthogonal electrical signal $U_{ORT}$ thereby delivering a cross-talk free signal $U_{MP}$ at the output of the multiplier MP forming a basis for the electrical output signal $U_0$ which is a measure for the amount of target particles TR (see FIG. 2). The object signal $U_{OB}$ is expressed by equation [3]:

$$U_{OB} \propto H_b \cos(\omega_1 t - \varphi) \cdot \sin \omega_1 t = \frac{1}{2} H_b \{\sin \varphi + \sin(2\omega_1 t - \varphi)\} \qquad [3]$$

After the low-pass filter LPF the output signal $U_0$ is expressed by equation [4]:

$$U_0 = \frac{1}{2} H_b \sin \varphi \qquad [4]$$

From equation [4] it is clear that the output signal $U_0$ is indicative to the number of paramagnetic beads SPB near the magnetic sensor MS and not to the magnetic cross-talk $H_{XT}$ since only the amplitude $H_b$ (see equation [2]) is present in equation [4] while the amplitude $H_1$ (see equation [1]) is not present. It is obvious from equation [4] that in order to reach the maximum gain in the magnetic sensor MS the sine of the phase lag (=sin φ) should equal one, thus the frequency $\omega_1$ of the magnetic main field H should preferably chosen such that the phase lag φ expressed in radians approximately equals π/2+n π, in which n is an integer number. Obviously, the phase shift in PHSFT is corrected for the delay c.q. phase shift in the amplifier.

Figure 6:
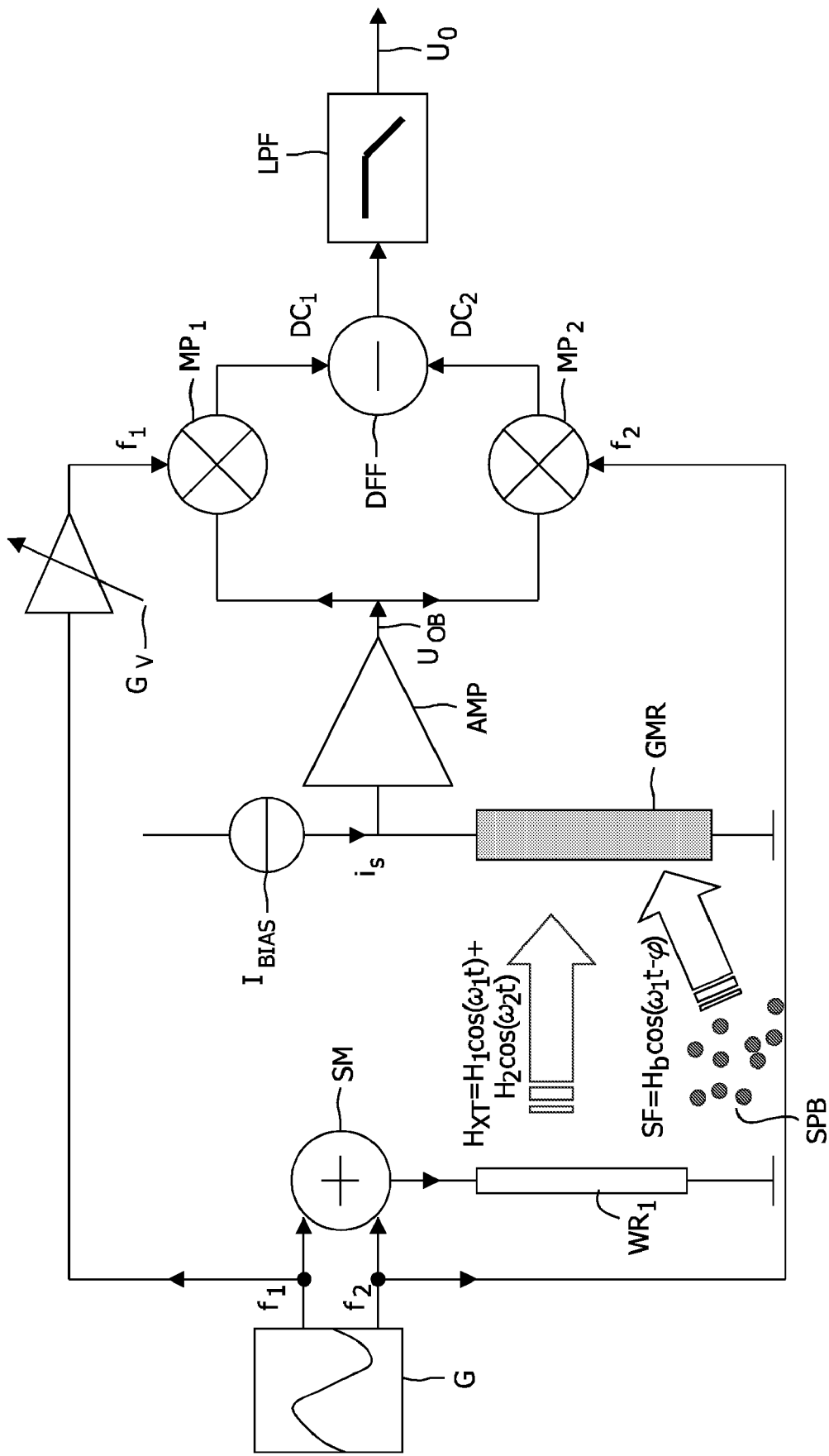
FIG. 6 shows an embodiment of the invention in which the amplitude difference of the cross-talk signal and the sensed stray field is used to discriminate between the cross-talk signal component in the object signal and the remainder of the object signal.

FIG. 6 shows an embodiment of the invention in which the amplitude difference of the cross-talk signal $H_{XT}$ and the sensed magnetic stray field SF is used to discriminate between the cross-talk signal components in the object signal $U_{OB}$ and the remainder of the object signal. Like in the previous embodiment the magnetic sensor MS comprises the AC-generator G, which now generates a first frequency $f_1$ and a second frequency $f_2$, the wire $WR_1$, the GMR, the DC-current source $I_{BIAS}$, the amplifier AMP, and the frequency low-pass filter LPF. It further comprises summing means SM, a gain adapter $G_v$, a first multiplier $MP_1$, a second multiplier $MP_2$, and a subtracter DFF. A first input of the multiplier $MP_1$ and a first input of the multiplier $MP_2$ are coupled to the output of the amplifier AMP. A second input of the first multiplier $MP_1$ is coupled via the gain adapter $G_v$, to receive an AC-signal having the first frequency $f_1$. A second input of the second multiplier $MP_2$ is coupled to receive an AC-signal having the second frequency $f_2$. The subtracter DFF is coupled with a first input to the output of the first multiplier $MP_1$ for receiving inter alia a first DC-signal $DC_1$, and with a second input to the output of the second multiplier $MP_2$ for receiving inter alia a second DC-signal $DC_2$. An output of the subtracter DFF is coupled to an input of the low-pass filter LPF to deliver the resulting signal after the subtraction. An output of the low-pass filter LPF delivers the output signal $U_0$. The summing means SM adds up the two AC-signals from the generator G and supplies an AC-current through the wire $WR_1$ having both the first and the second frequencies $f_1$ and $f_2$ (having equal amplitudes).

The gain adapter $G_v$ may alternatively be put in between the generator G and the second input of the second multiplier $MP_2$. Other alternative positions for the gain adapter $G_v$ are: in between the output of the amplifier AMP and the first input of the first multiplier $MP_1$, in between the output of the amplifier AMP and the first input of the second multiplier $MP_2$, in between the output of the first multiplier $MP_1$ and the first input of the subtracter DFF, and in between the output of the second multiplier $MP_2$ and the second input of the subtracter DFF.

Figure 5:
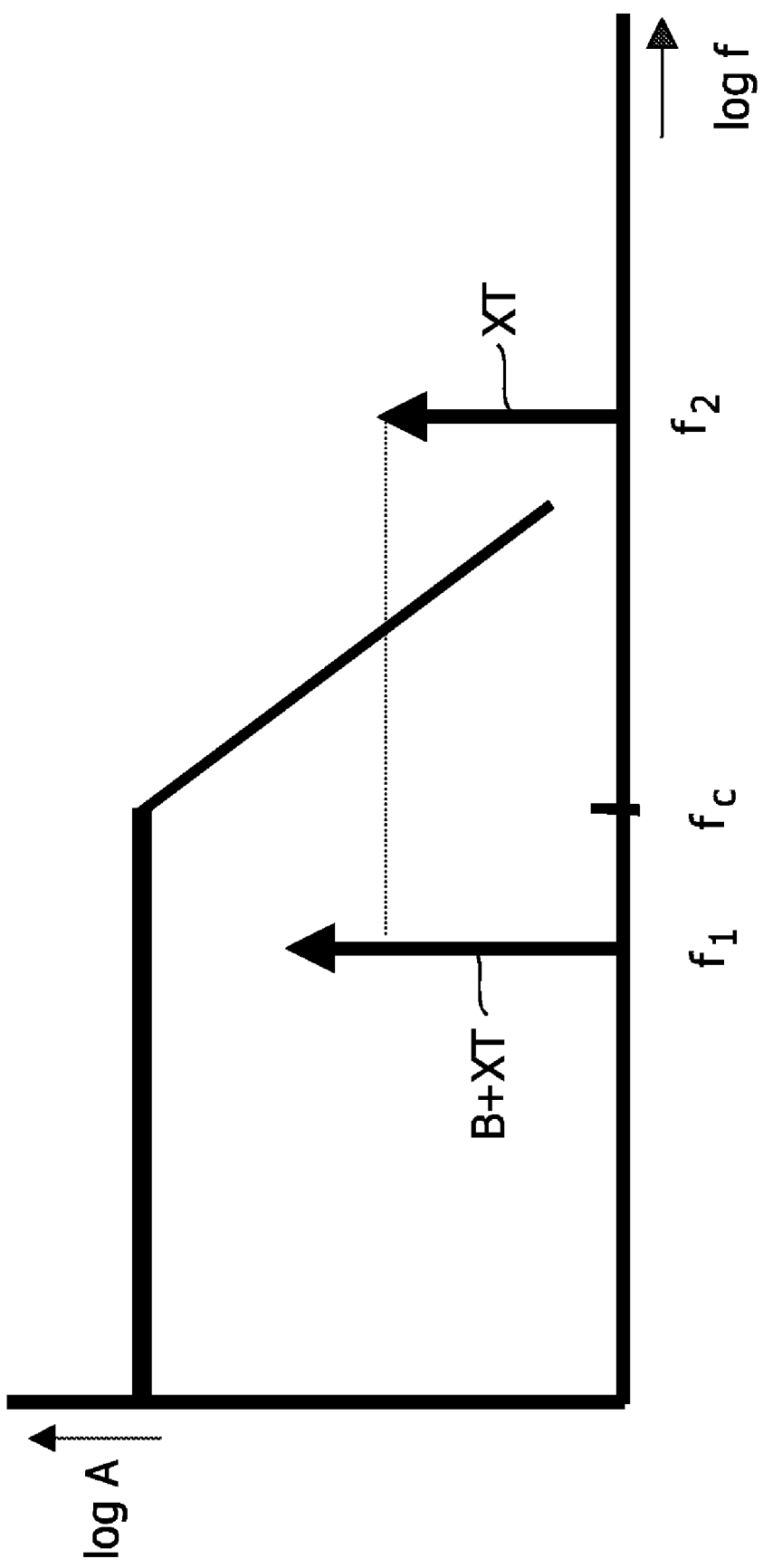
FIG. 5 shows a bode-diagram for further elucidating the inventive embodiment as shown in FIG. 6.

FIG. 5 shows a bode-diagram for further elucidating the inventive embodiment as shown in FIG. 6.

The functioning of this embodiment is as follows. The applied magnetic main field H (see FIG. 2) consists of two frequencies: a relatively low frequency $f_1$ and a relatively high frequency $f_2$. The magnetic cross talk $H_{XT}$ is not frequency dependent, so the amplitude of the resulting cross talk signal will be the same for both frequencies. Thus the cross-talk signal $H_{XT}$ is expressed by equation [5]:

$$H_{XT}=H_1 \cos \omega_1 t+H_2 \cos \omega_2 t \quad [5]$$

The signal from the paramagnetic beads SPB, however, is frequency dependent. If the frequency $f_1$ of the applied magnetic field $H_1$ is much higher than the bead magnetization cut-off frequency ($\omega_c=1/\tau_{Neel}$), the paramagnetic beads SPB are hardly magnetized, i.e. the paramagnetic beads SPB are too "slow" to follow the applied magnetic main field $H_1$ and the detected signal is much smaller.

In the extreme and preferred case, $f_1<f_c$ and $f_2>>f_c$, the amplitude of the signal at $f_1$ contains both cross talk and signal from the paramagnetic beads SPB, while the amplitude of the signal at $f_2$ is just cross talk since the stray field SF has practically reduced to zero at $f_2$, as can be deducted from the bode-diagram of FIG. 5. In the latter case the stray field SF is expressed by equation [2].

Parallel demodulation of the object signal $U_{OB}$, once with the first multiplier $MP_1$ with the first frequency $f_1$ and once with the second multiplier $MP_2$ with the second frequency $f_2$, results, among others, in the first DC-signal $DC_1$ and the second DC-signal $DC_2$, respectively. Basically the first DC-signal $DC_1$ is expressed by equation [6]:

$$DC_1=H_1+H_b \quad [6]$$

and the second DC-signal $DC_2$ is expressed by equation [7]:

$$DC_2=H_2 \quad [7]$$

With the assumption that $H_1=H_2$ the resulting DC-component in the resulting signal delivered by the subtracter DFF will only comprise the value $H_b$. Preferably this resulting signal is filtered by the low-pass filter LPF to deliver the pure DC-signal $U_0$ with value $H_b$. Ideally the adapter $G_V$ is not necessary (or to say it differently it has a gain value equal to 1). In case however that the value $H_1$ is not equal to the value $H_2$, the signal $U_0$ can still be determined by only the value $H_b$ if the gain adapter $G_v$ is present and delivers an appropriate gain correction factor. By this it is also possible if for instance the second frequency $f_2$ is not $>>f_1$ but only $>f_1$. Although not preferred, the invention still works if even both the first and second frequencies $f_1$ and $f_2$ are above the so-called cut-off frequency $f_c$. Anyhow $f_2>f_c$.

FIG. 7 shows an embodiment of the invention in which an additional magnetic main field is generated to compensate for the magnetic cross-talk field. In the previous mentioned embodiments of the invention the effect of the magnetic cross-talk is reduced. It is however also possible to more directly eliminate the magnetic cross-talk. Therefore there is provided a first external magnetic field generator implemented by a first coil $L_A$ for generating a first magnetic main field $H_A$ for magnetizing the magnetizable object SPB, and cross-talk reduction means for reducing a cross-talk signal component in the electrical object signal caused by magnetic cross-talk between the first external magnetic field $H_A$ and the magnetic stray field SF (not indicated in FIG. 7, but see FIG. 2). The cross-talk reduction means comprises a second external magnetic field generator implemented by a second coil $L_B$ for generating a second magnetic main field $H_B$ for compensating for the magnetic cross-talk between the first external magnetic main field $H_A$ and the magnetic stray field SF.

This method of using interfering fields $H_A$, $H_B$ with the same phase and frequency to cancel the components in the x-direction can be used for sensors using an internally applied field (like in the previous embodiments) to magnetize the paramagnetic beads SPB or using an externally applied field to magnetize the paramagnetic beads SPB as is indicated in FIG. 7. In the latter case the second coil $L_B$ is used to cancel any magnetic cross talk resulting from a slight misalignment of the first coil $L_A$ from the applied first magnetic main field $H_A$ not being perfectly homogeneous or any other reason which causes cross-talk for instance reasons previously mentioned with the other embodiments of the invention. By way of example in FIG. 7 the first coil $L_A$, which is used to magnetize the paramagnetic beads SPB, is misaligned in such a way that the field $H_A$ it generates has a small component in the x-direction. In FIG. 7 this misalignment is indicated by the angle α not being equal to zero. During operation of the magnetic sensor MS respectively first and second AC-currents, having the same frequency, flow through respectively the first and second coils $L_A$ and $L_B$. By using the second coil $L_B$ to generate the second magnetic main field $H_B$ with the same x-component amplitude, but opposite in direction, the x-component (which is cross-talk) can be cancelled. The resulting field $H_{res}$ has thus no x-component, i.e. the magnetic cross talk is cancelled and thus there will be only a horizontal (externally caused) magnetic field in the x-direction in the GMR caused by the magnetic stray field SF. Possibly the cross-talk cancellation can be performed automatically, e.g. by applying generally known feedback techniques.

FIG. 8 shows an inventive method in which before the actual (bio-) measurement, when no paramagnetic beads SPB are present yet, the amplitude of the object signal $U_{OB}$ is measured and stored, and during the actual measurements, when paramagnetic beads are present, the stored amplitude is subtracted from the amplitude of the current object signal $U_{OF}$, thereby delivering a cross-talk-free output signal.

During a first main step the magnetic sensor MS generates a magnetic main field H in the absence of any magnetizable object e.g. in the absence of paramagnetic beads. Then the magnetic field H is sensed as if this field would have come from paramagnetic beads in case it would have been present. Thus an electrical object signal $U_{OB}$ is created in the absence of any paramagnetic beads. This means that the object signal $U_{OB}$ is basically 100 percent magnetic cross-talk. The electrical object signal $U_{OB}$ is filtered by the frequency low-pass LPF. The resulting output signal $U_0$ is a pure DC-signal. This signal is stored in a memory MM.

During a second main step the magnetic sensor MS generates a magnetic main field H while the paramagnetic beads SPB are present. Then the magnetic field H is sensed and a further electrical object signal $U_{FOB}$ is generated. Because of the fact that now paramagnetic beads SPB are present the further electrical object signal $U_{FOB}$ is both determined by the sensed magnetic stray field SF, and thus comprises information with regard to the amount of targets TR (see FIG. 2), and magnetic cross-talk. The further electrical object signal $U_{OB}$ is also filtered by the frequency low-pass LPF. The resulting further output signal $U_{OF}$ is also a pure DC-signal. The stored DC-signal during the first main step is then subtracted, by a subtracter SBSTR, from the currently generated DC-signal thereby generating a DC-output voltage $U_{OUT}$ which is a cross-talk free DC-signal representing the number of targets TR. This is because the cross-talk component in both signals $U_0$ and $U_{OF}$ are equal. Of course said subtraction may also be reversed. Further it is also possible to also store the signal $U_{OF}$, then later retrieving both signals $U_0$ and $U_{OF}$ and mutually subtracting these signals thereby generating the DC-output voltage $U_{OUT}$.

It should be noted that the above-mentioned embodiments illustrate rather than limit the invention, and those skilled in the art will be capable of designing alternative embodiments without departing from the scope of the invention as defined by the appended claims. In the claims, any reference signs placed in parentheses shall not be construed as limiting the claims. The words "comprising" and "comprises", and the like, do not exclude the presence of elements other than those listed in any claim or in the application as a whole. The singular reference of an element does not exclude the plural reference of such elements. The mere fact that certain measures are recited in mutually different dependent claims does not indicate that a combination of these measures can not be used. Any terms like top, bottom, over, under and the like in the description and the claims are used for descriptive purposes and not necessarily for describing relative positions. It is to be understood that the terms so used are interchangeable under appropriate circumstances and that the embodiments of the invention described herein are capable of operation in other orientations than described or illustrated by the Figures.

The invention claimed is:

1. A magnetic sensor (MS) for sensing a magnetic stray field (SF) generated by a magnetizable object (SPB) when magnetized and for generating an electrical object signal ($U_{OB}$) which depends on the sensed magnetic stray field (SF), comprising a magnetic field generator ($WR_1$, $WR_2$) for generating a magnetic main field (H) for magnetizing the magnetizable object (SPB), and cross-talk reduction means for reducing the effect of a cross-talk signal component in the electrical object signal ($U_{OB}$) caused by magnetic cross-talk between the magnetic main field (H) and the magnetic stray field (SF), wherein the cross-talk reduction means is arranged for distinguishing a signal property between the cross-talk signal component and the remaining part of the electrical object signal ($U_{OB}$) and for generating an electrical output signal ($U_0$).

2. A sensor (MS) as claimed in claim 1, characterized in that the signal property is the phase of a signal.

3. A sensor (MS) as claimed in claim 2, characterized in that the cross-talk reduction means comprises means (PHSFT) for generating an orthogonal electrical signal ($U_{ORT}$) which is orthogonal in relation to the cross-talk signal component, a multiplier (MP) for multiplying the orthogonal electrical signal ($U_{ORT}$) with the electrical object signal ($U_{OB}$), the resulting signal ($U_{MP}$) after said multiplication forming a basis for the electrical output signal ($U_0$).

4. A sensor (MS) as claimed in claim 3, characterized in that the cross-talk reduction means comprises a low-pass filter (LPF) for filtering said resulting signal ($U_{MP}$) after said multiplication, the resulting signal after said low-pass filter being the electrical output signal ($U_0$).

5. A sensor (MS) as claimed in claim 3, characterized in that the frequency ($f_1$, $\omega_1$) of the magnetic main field (H, $H_1$) is chosen such that the phase difference between the sensed magnetic stray field (SF) and the magnetic main field (H, $H_1$) expressed in radians approximately equals $\pi/2+n\,\pi$, in which n is an integer number.

6. A sensor (MS) as claimed in claim 1, characterized in that the signal property is the amplitude of a signal.

7. A sensor (MS) as claimed in claim 6, characterized in that the magnetic main field (H) comprises a first magnetic signal ($H_1$) having a first frequency ($f_1$, $\omega_1$) and a second magnetic signal ($H_2$) having a second frequency ($f_2$, $\omega_2$) which is substantially larger than the first frequency ($f_1$, $\omega_1$) and which is larger than the magnetization cut-off frequency of the magnetizable object (SPB), the first and second magnetic signals ($H_1$, $H_2$) producing a first electrical signal component in the electrical object signal ($U_{OB}$) having the first frequency ($f_1$) and having a first amplitude and producing a second electrical signal component in the electrical object signal ($U_{OB}$) having the second frequency ($f_2$) and a second amplitude, and in that the cross-talk reduction means comprises means ($G_v$, $MP_1$, $MP_2$, DFF) for measuring the amplitudes ($DC_1$, $DC_2$) of the first and the second electrical signal components and for mutually subtracting the measured amplitudes ($DC_1$, $DC_2$), the resulting signal after said subtraction forming a basis for the electrical output signal ($U_0$).

8. A sensor (MS) as claimed in claim 7, characterized in that the cross-talk reduction means comprises a low-pass filter (LPF) for filtering said resulting signal after said subtraction, the resulting signal after said low-pass filter being the electrical output signal ($U_0$).

9. A sensor (MS) as claimed in claim 7, characterized in that the first frequency ($f_1$) is lower than said magnetization cut-off frequency ($f_c$) and that the second frequency ($f_2$) is much higher than said magnetization cut-off frequency ($f_c$).

10. A magnetic sensor (MS) for sensing a magnet stray field (SF) generated by a magnetizable object (SPB) when magnetized and for generating an electrical object signal which depends on the sensed magnetic stray field (SF), comprising a first external magnetic field generator ($L_A$) for generating a first magnetic main field ($H_A$) for magnetizing the magnetizable object (SPB), and cross-talk reduction means for reducing a cross-talk signal component in the electrical object signal caused by magnetic cross-talk between the first external magnetic main field ($H_A$) and the magnetic stray field (SF), the cross-talk reduction means comprising a second external magnetic field generator ($H_B$) for generating a second magnetic main field ($H_B$) for compensating for the magnetic cross-talk between the first external magnetic main field ($H_A$) and the magnetic stray field (SF).

11. A magnetic sensor (MS) as claimed in claim 10, characterized in that the first and second external magnetic field generators comprise first and second coils ($L_A$, $L_B$) through which respectively first and second AC-currents, having the same frequency, flow during operation of the magnetic sensor (MS).

12. A magnetic sensor (MS) as claimed in claim 11, characterized in that the cross-talk reduction means comprises means for adapting the ratio of the amplitudes of the first and second AC-currents for minimizing the magnetic cross-talk.

13. A magnetic sensor (MS) as claimed in claim 11, characterized in that the cross-talk reduction means comprises means for adapting the difference of the phases of the first and second AC-currents for minimizing the magnetic cross-talk.

14. A biochip (BCP) comprising a magnetic sensor (MS) as claimed in claim 1.

15. A method for sensing a magnetic stray field (SF) generated by a magnetizable object (SPB) when magnetized comprising the steps of:
  generating a magnetic main field (H) for magnetizing the magnetizable object (SPB),
  sensing the magnetic stray field (SF) generated from the magnetizable object (SPB),
  generating an electrical object signal ($U_{OB}$) from the sensed magnetic stray field (SF),
  distinguishing a signal property between a cross-talk signal in the electrical object signal ($U_{OB}$), caused by magnetic cross-talk between the magnetic main field (H) and the sensed magnetic stray field (SF), and the remaining part of the electrical object signal ($U_{OB}$), and
  using the distinguished signal property for generating an electrical output signal ($U_O$).

16. A method for sensing a magnetic stray field (SF) generated by a magnetizable object (SPB) when magnetized comprising the steps of:
  generating a first magnetic main field ($H_A$) for magnetizing the magnetizable object (SPB),
  sensing the magnetic stray field (SF) generated from the magnetizable object (SPB),
  generating an electrical object signal from the sensed magnetic stray field (SF),
  generating a second magnetic main field ($H_B$) for compensating for a magnetic cross-talk signal in the electrical object signal, caused by magnetic cross-talk between the first magnetic main field ($H_A$) and the sensed magnetic stray field (SF), and
  generating an electrical output signal.

17. A method for sensing a magnetic stray field (SF) generated by a magnetizable object (SPB) when magnetized comprising the steps of:
  in a first main step applying the steps of:
    generating a magnetic main field (H) in the absence of any magnetizable object,
    sensing the magnetic field (H) as if it would have been a magnetic stray field generated from a magnetizable object if it would have been present,
    generating an electrical object signal ($U_{OB}$) from the sensed magnetic field (SF),
    measuring the amplitude of the electrical object signal ($U_{OB}$),
    storing the amplitude of the electrical object signal ($U_{OB}$) in a memory (MM),
  in a second main step applying the steps of:
    generating a magnetic main field (H) for magnetizing the magnetizable object (SPB),
    sensing the magnetic stray field (SF) generated from the magnetizable object (SPB),
    generating a further electrical object signal ($U_{FOB}$) from the sensed magnetic stray field (SF), and
    measuring the amplitude of the further electrical object signal ($U_{FOB}$),
    retrieving the stored amplitude of the electrical object signal ($U_{OB}$), and
    mutually subtracting (SBTR) the stored amplitude and the amplitude of the further electrical object signal ($U_{OB}$) thereby generating an electrical output signal ($U_{OUT}$).

* * * * *